US012253190B2

(12) United States Patent
Gregor et al.

(10) Patent No.: US 12,253,190 B2
(45) Date of Patent: Mar. 18, 2025

(54) NON-ELASTOMERIC, NON-POLYMERIC, NON-METALLIC MEMBRANE VALVES FOR SEMICONDUCTOR PROCESSING EQUIPMENT

(71) Applicant: Lam Research Corporation, Fremont, CA (US)

(72) Inventors: Mariusch Gregor, Gilroy, CA (US); Theodoros Panagopoulos, Los Gatos, CA (US); Thorsten Bernd Lill, Kalaheo, HI (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/489,829

(22) Filed: Oct. 18, 2023

(65) Prior Publication Data

US 2024/0044422 A1 Feb. 8, 2024

Related U.S. Application Data

(63) Continuation of application No. 17/629,740, filed as application No. PCT/US2020/043318 on Jul. 23, 2020, now Pat. No. 11,796,085.

(60) Provisional application No. 62/879,274, filed on Jul. 26, 2019.

(51) Int. Cl.
*F16K 99/00* (2006.01)
*H01L 21/67* (2006.01)

(52) U.S. Cl.
CPC ...... *F16K 99/0015* (2013.01); *F16K 99/0028* (2013.01); *F16K 99/0059* (2013.01); *H01L 21/67017* (2013.01)

(58) Field of Classification Search
CPC ............ F16K 99/0015; F16K 99/0028; F16K 99/0059; H01L 21/67017
USPC ........... 137/625.4, 315.05, 505.36, 851, 859; 251/331, 332
See application file for complete search history.

(56) References Cited

U.S. PATENT DOCUMENTS

| 4,037,784 A | 7/1977 | Sabarly |
| 4,581,624 A * | 4/1986 | O'Connor ................. F15C 5/00 |
| | | 216/2 |
| 4,756,508 A | 7/1988 | Giachino et al. |
| 4,846,215 A | 7/1989 | Barree |
| 5,082,242 A | 1/1992 | Bonne et al. |

(Continued)

FOREIGN PATENT DOCUMENTS

| CN | 101282789 A | 10/2008 |
| CN | 105636697 A | 6/2016 |

(Continued)

OTHER PUBLICATIONS

CN Office Action dated Dec. 12, 2023 in CN Application No. 202080067255.3 with English Translation.

(Continued)

*Primary Examiner* — Minh Q Le
(74) *Attorney, Agent, or Firm* — Weaver Austin Villeneuve & Sampson LLP

(57) ABSTRACT

Non-elastomeric, non-polymeric, non-metallic membrane valves for use in high-vacuum applications are disclosed. Such valves are functional even when the fluid-control side of the valve is exposed to a sub-atmospheric pressure field which may generally act to collapse/seal traditional elastomeric membrane valves.

20 Claims, 7 Drawing Sheets

(56) References Cited

U.S. PATENT DOCUMENTS

| | | | |
|---|---|---|---|
| 5,238,223 | A | 8/1993 | Mettner et al. |
| 5,323,999 | A | 6/1994 | Bonne et al. |
| 5,340,081 | A | 8/1994 | Wright |
| 5,640,995 | A | 6/1997 | Packard et al. |
| 5,681,024 | A | 10/1997 | Lisec et al. |
| 6,126,140 | A | 10/2000 | Johnson et al. |
| 6,129,331 | A * | 10/2000 | Henning .............. F16K 99/0001 137/341 |
| 6,557,820 | B2 * | 5/2003 | Wetzel ................ F16K 99/0059 251/30.05 |
| 6,786,708 | B2 | 9/2004 | Brown et al. |
| 6,830,229 | B2 * | 12/2004 | Wetzel ................ F16K 99/0001 251/30.05 |
| 6,986,365 | B2 | 1/2006 | Henning et al. |
| 7,438,030 | B1 | 10/2008 | Okojie |
| 8,555,925 | B2 * | 10/2013 | Stadel .................. B65D 77/225 383/100 |
| 9,574,674 | B2 * | 2/2017 | Maeda ................... F16K 15/144 |
| 11,181,104 | B2 * | 11/2021 | Shabanian ........... F04B 53/1087 |
| 11,796,085 | B2 | 10/2023 | Gregor et al. |
| 2002/0124897 | A1 * | 9/2002 | Bergh .................... G01N 30/20 137/885 |
| 2002/0127146 | A1 | 9/2002 | Bergh et al. |
| 2004/0075073 | A1 * | 4/2004 | Claydon ............. B81C 1/00492 251/129.01 |
| 2004/0209354 | A1 | 10/2004 | Mathies et al. |
| 2006/0105685 | A1 | 5/2006 | Kajiwara et al. |
| 2007/0166200 | A1 | 7/2007 | Zhou et al. |
| 2011/0233443 | A1 * | 9/2011 | Kamada .................... F16K 7/14 428/603 |
| 2012/0012774 | A1 | 1/2012 | Yanagida |
| 2012/0316492 | A1 | 12/2012 | Chappel |
| 2015/0021501 | A1 | 1/2015 | Ono et al. |
| 2016/0114591 | A1 | 4/2016 | Kudo |
| 2018/0130640 | A1 * | 5/2018 | Gregor ................ C23C 16/5096 |
| 2018/0272347 | A1 | 9/2018 | Zenhausern et al. |
| 2019/0063421 | A1 | 2/2019 | Mou et al. |
| 2020/0038864 | A1 * | 2/2020 | Ball ..................... B01L 3/50273 |
| 2020/0408332 | A1 | 12/2020 | Li et al. |
| 2022/0252183 | A1 | 8/2022 | Gregor et al. |

FOREIGN PATENT DOCUMENTS

| | | |
|---|---|---|
| EP | 3254008 A1 | 12/2017 |
| JP | 2006090527 A | 4/2006 |
| JP | 2019045494 A | 3/2019 |
| WO | WO-2018089196 A1 | 5/2018 |

OTHER PUBLICATIONS

International Preliminary Report on Patentability dated Feb. 10, 2022 issued in Application No. PCT/US2020/043318.

International Search report and Written Opinion dated Oct. 13, 2020, issued in PCT/US2020/043318.

JP Office Action dated May 21, 2024 in JP Application No. 2022-505391 with English translation.

Oh K.W., et al., "A review of microvalves," Journal of Micromechanics and Microengineering, May 2006, vol. 16 (5), pp. 13-39.

U.S. Notice of Allowance dated Jun. 7, 2023 in U.S. Appl. No. 17/629,740.

* cited by examiner

NON-ELASTOMERIC, NON-POLYMERIC, NON-METALLIC MEMBRANE VALVES FOR SEMICONDUCTOR PROCESSING EQUIPMENT

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

In semiconductor processing operations, it is often necessary to provide a multitude of gases that may be flowed into a semiconductor processing chamber in various combinations, at various flow rates, and at various times. In some semiconductor processing tools, it is not uncommon to find as many as 15-20 different gases being supplied to the tool, with each gas typically being separately controlled. Semiconductor processing tools typically include "gas boxes" that house a large number of different computer-controlled valves, mass flow controllers, and/or other gas-flow components that may be controlled to provide desired mixtures of gases at various times during semiconductor processing operations.

It is typical for such gas boxes to be assembled out of discrete components, e.g., surface-mount valves, manifold channels, seals, etc., that are relatively large, e.g., that feature, for example, 1.5" square mounting flanges for interfacing the flow components with their respective manifolds. Such components may be assembled together into a "gas stick" for each gas to be controlled, and the gas sticks then mounted into a cabinet to form the "gas box." A gas stick may include multiple surface-mount components, e.g., 5 to 10 such components, and semiconductor processing tools may include multiple, e.g., 10 or 20, of such gas sticks.

Presented herein are new designs for semiconductor processing gas flow control components that may be used to provide a much more compact valving system.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some implementations, an apparatus may be provided that includes a substrate having one or more microfluidic valve structures, each microfluidic valve structure of the one or more microfluidic valve structures including a diaphragm, the diaphragm having a nominal diameter $D_d$, a first side, and a second side opposite the first side; a base; an orifice in the base, the orifice having cross-sectional area $A_o$ in a plane parallel to the base; and a raised seat structure, the raised seat structure having a nominal outer diameter $D_o$ and a nominal inner diameter $D_i$. For each microfluidic valve structure in such an apparatus, the diaphragm may be made from a non-elastomeric material, the raised seat structure may extend from the base towards the first side of the diaphragm, a surface of the raised seat structure facing the diaphragm may be separated from the first side of the diaphragm by a gap of distance d when the microfluidic valve structure is in an unactuated state, $D_i$ may be less than or equal to $0.2 \cdot D_d$, $A_o$ may be less than or equal to $$\frac{d \cdot D_i \cdot \pi}{2},$$

and the diaphragm, the raised seat structure, and the gap of that microfluidic valve structure may be sized such that, when that microfluidic valve structure is transitioned to an actuated state by pressurizing the second side of the diaphragm to a first pressure, a portion of the diaphragm is caused to elastically deform towards, and seal against, the raised seat structure.

In some such implementations, for one or more of the microfluidic valve structures, $A_o$ may be less than or equal to $$\frac{d \cdot D_i \cdot \pi}{2}$$

and $A_o$ may be greater than or equal to $$0.9 \frac{d \cdot D_i \cdot \pi}{2}.$$

In some other such implementations, for one or more of the microfluidic valve structures, $A_o$ may be less than or equal to $$\frac{d \cdot D_i \cdot \pi}{2}$$

and $A_o$ may be greater than or equal to $$0.8 \frac{d \cdot D_i \cdot \pi}{2}.$$

In some other such implementations, for one or more of the microfluidic valve structures, $A_o$ may be less than or equal to $$\frac{d \cdot D_i \cdot \pi}{2}$$

and $A_o$ may be greater than or equal to $$0.7 \frac{d \cdot D_i \cdot \pi}{2}.$$

In some other such implementations, for one or more of the microfluidic valve structures, $A_o$ may be less than or equal to $$\frac{d \cdot D_i \cdot \pi}{2}$$

and $A_o$ may be greater than or equal to $$0.6 \frac{d \cdot D_i \cdot \pi}{2}.$$

In some other such implementations, for one or more of the microfluidic valve structures, $A_o$ may be less than or equal to $$\frac{d \cdot D_i \cdot \pi}{2}$$

and $A_o$ may be greater than or equal to $$0.5 \frac{d \cdot D_i \cdot \pi}{2}.$$

In some other such implementations, for one or more of the microfluidic valve structures, $A_o$ may be less than or equal to $$\frac{d \cdot D_i \cdot \pi}{2}$$

and $A_o$ may be greater than or equal to $$\frac{d \cdot D_i \cdot \pi}{2 \cdot 625}.$$

In some implementations, for a first microfluidic valve structure of the one or more microfluidic valve structures, a maximum distance along a first axis between the first side of the diaphragm for the first microfluidic valve structure and the surface of the raised seat structure for the first microfluidic valve structure may be less than or equal to 40 μm, and the first axis may be perpendicular to the surface of the raised seat structure for the first microfluidic valve structure.

In some implementations of the apparatus, the first side of the diaphragm for a first microfluidic valve structure of the one or more microfluidic valve structures may be subjected to a pressure at or below atmospheric pressure and the second side of the diaphragm of the first microfluidic valve structure may be subjected to atmospheric pressure when the first microfluidic valve structure is in the unactuated state.

In some implementations of the apparatus, the first pressure for the first microfluidic valve structure may be above atmospheric pressure.

In some implementations of the apparatus, the diaphragm for at least one of the one or more microfluidic valve structures may be made from silicon or silicon dioxide.

In some implementations of the apparatus, at least one of the one or more microfluidic valve structures may be made from multiple layers of silicon or silicon dioxide.

In some implementations of the apparatus, the apparatus may be configured to be connected to a gas supply such that at least a first microfluidic valve structure of the one or more microfluidic valve structures is part of a flow path within the apparatus that is configured to be fluidically connectable with the gas supply such that the raised seat structure for the first microfluidic valve structure is fluidically interposed between the gas supply and the diaphragm for the first microfluidic valve structure.

In some such implementations of the apparatus, the apparatus may further include the gas supply, and the apparatus may be connected to the gas supply such that the raised seat structure for the first microfluidic valve structure is fluidically interposed between the gas supply and the diaphragm for the first microfluidic valve structure.

In some implementations of the apparatus, the apparatus may further include a diaphragm layer, an actuator plenum layer, and a valve plenum layer. In such implementations, the diaphragm of a first microfluidic valve structure of the one or more microfluidic valve structures may be provided by the diaphragm layer, a first side of the diaphragm layer may provide the first side of the diaphragm of the first microfluidic valve structure, a second side of the diaphragm layer may provide the second side of the diaphragm of the first microfluidic valve structure, the first side of the diaphragm layer may be bonded to the valve plenum layer, the second side of the diaphragm layer may be bonded to the actuator plenum layer, the actuator plenum layer may have a hole through it with a diameter $D_{apl}$ that is centered on the diaphragm of the first microfluidic valve structure, the valve plenum layer may have a hole through it with a diameter $D_{vpl}$ that is also centered on the diaphragm of the first microfluidic valve structure, and $D_{vpl}$ may be less than $D_{apl}$.

BRIEF DESCRIPTION OF THE DRAWINGS

The various implementations disclosed herein are illustrated by way of example, and not by way of limitation, in the figures of the accompanying drawings, in which like reference numerals refer to similar elements.

Figure 1:
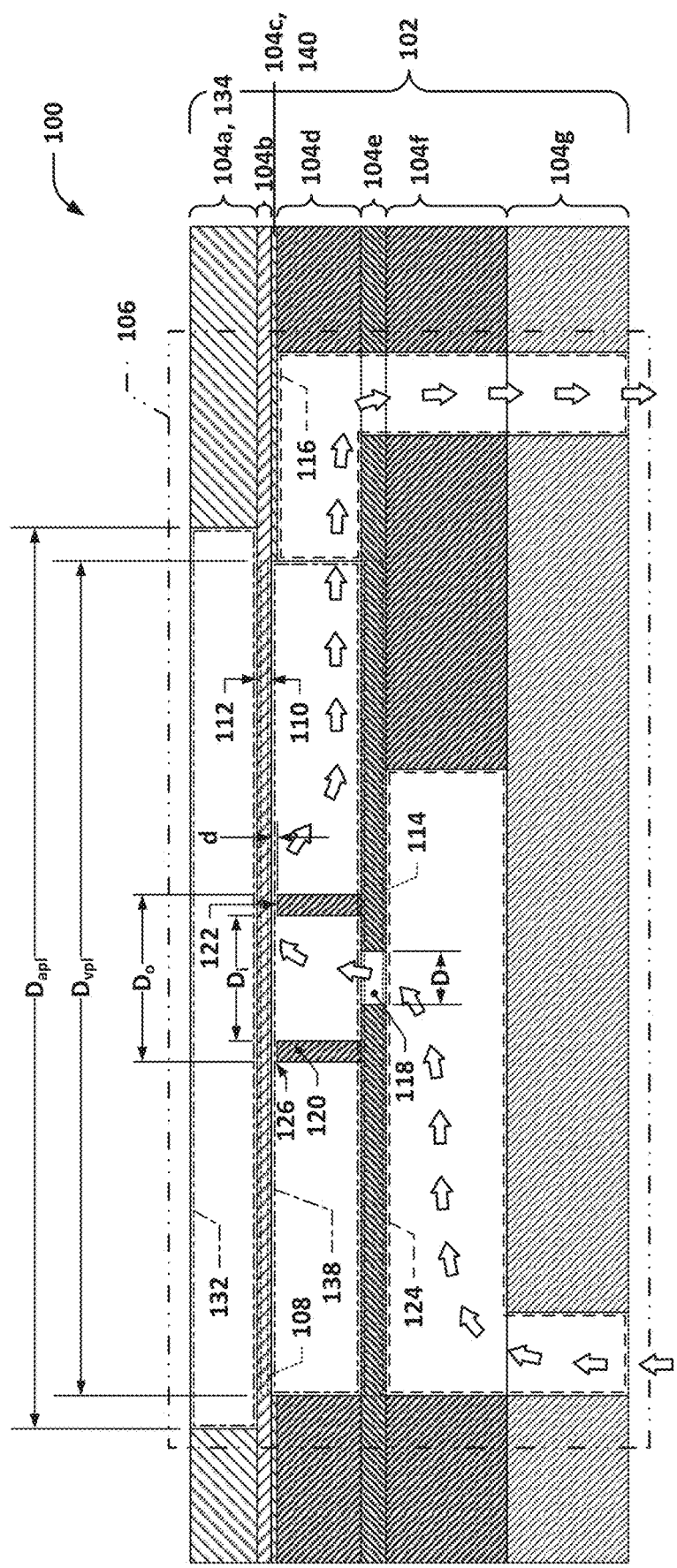
FIG. 1 depicts an example apparatus with a non-elastomeric, non-polymeric, non-metallic microfluidic valve structure.

The Figures herein are generally not drawn to scale, although various aspects of the Figures, e.g., as discussed below, may be drawn to scale.

DETAILED DESCRIPTION

Modern semiconductor processing tools often utilize a large number of different processing gases that are introduced to a semiconductor processing chamber at different times, in different combinations, and at different flow rates. In some modern semiconductor processing tools, some reactant gases may be flowed in an alternating fashion, with each sequential flow of reactant gas being followed by a flow of inert or purge gas that is used to sweep out any remnants of that reactant prior to the flow of a subsequent reactant. This prevents the two reactants from mixing within the gas distribution system, which may produce undesirable side effects (although such mixing may be desirable once the reactant gases are within the semiconductor processing chamber). One issue with traditional gas control component usage is that the flow paths involved are often long and may include significant lengths that are in between the last controllable flow component for a given gas supply and the point where the gas is flowed into the semiconductor processing chamber. The gas that is trapped in such a flow path may be wasted.

In order to provide a more compact, low-cost solution for gas flow control in semiconductor processing tools, the present inventors conceived of new types of non-elastomeric, non-polymeric, non-metallic membrane valves. Such membrane valves may, in some respects, be somewhat similar to elastomeric microfluidic membrane valves used, for example, in microfluidic cartridges or other liquid-base analysis systems. However, due to the operating pressures typically seen in semiconductor processing systems, as well as the often highly toxic or reactive reactant gases typically handled by such systems, microfluidic valve technology that is frequently used for liquid-based microfluidic handling, e.g., such as may be used in genetic sequencing systems, is not suitable. For example, elastomeric microfluidic valves that are commonly used in microfluidic applications for chemical and biological analysis may be susceptible to chemical attack or gas permeation through the elastomeric membranes used in such valves. Moreover, since most semiconductor processing chambers are operated at sub-atmospheric pressures, it may often be the case that the downstream pressure environment for such valves, and thus the side of such elastomeric membranes that provides the sealing in such valves, would be at a reduced pressure compared to the other side of such membranes, which would generally cause such elastomeric membranes to deform into a "sealed" state and be difficult or impossible to reliably open.

To address such issues, the present inventors conceived of non-elastomeric, non-polymeric, non-metallic membrane valves in which the valves are made of layers of non-elastomeric, non-polymeric, and non-metallic materials that are bonded together to form a layered stack. Such materials may be selected so as to be non-reactive with the gases that are flowed through such valves, e.g., silicon (e.g., glass) or silicon dioxide (e.g., quartz). By avoiding the use of polymeric and elastomeric materials, the issues with potential gas permeation through the membranes of such valves are avoided; avoiding the use of metallic materials reduces the risk of adverse chemical reaction between the valve material and the processing gases that may be handled by the valves.

In an elastomeric membrane valve, a thin elastomeric membrane layer is typically overlaid on a substrate that has an inlet port and an outlet port that may be sealed by the elastomeric membrane layer when the elastomeric membrane layer is in contact with the substrate. In some such valves, there may be a spacer layer in between the elastomeric membrane and the substrate that results in a gap between the elastomeric membrane and the substrate when the elastomeric membrane is in an undeformed state, thereby allowing for liquid or gas to flow from one port to the other; when pressure is applied to the side of the elastomeric membrane opposite the gap, the elastomeric membrane deflects towards and contacts the inlet port and the outlet port, thereby sealing them. In other such valves, the elastomeric membrane may be flush against the substrate when undeformed, thereby sealing the inlet port and the outlet port. When the side of the elastomeric membrane opposite the side that is sealed against the inlet and outlet is subjected to a reduced pressure, the elastomeric membrane may be caused to distend upwards, thereby allowing fluid to flow from the inlet to the outlet. When the actuation pressure (or negative pressure) is removed, the elastomeric membrane returns to its undeformed state. Elastomeric materials, e.g., silicone, are typically used in such valves since such materials are liquid-tight (and most microfluidic systems are used to transport liquids), robust, and capable of undergoing large strains without permanent deformation or rupture. This makes such elastomeric membranes a relatively ideal choice in most cases, as the pliability of the elastomeric membrane material allows it to conform to the interior surfaces of the valve structure, thereby achieving a very good seal against the inlet and outlet ports, and can withstand repeated actuations and relatively large-scale deflections. Microfluidic valves with elastomeric membrane valves may also have a generally rigid structural layer or layers in addition to the elastomeric membrane layer that provides overall rigidity to the valve structure. Such rigid structural layers may, for example, be provided by non-elastomeric polymeric materials, e.g., acrylic or polycarbonate, or by non-elastomeric, non-polymeric materials, such as glass.

In the present non-elastomeric, non-polymeric, non-metallic membrane valves, however, the entire wetted valve structure (i.e., the portions of the valve that come into contact with the fluid flow that the valve is designed to control), including the membrane, may be made from non-elastomeric, non-polymeric, and non-metallic materials. In particular, materials such as silicon (glass) or silicon dioxide (quartz) may be used, both of which are largely non-reactive with most semiconductor processing gases. While such materials provide good resistance to chemical attack, glass and quartz are both very brittle materials, which severely limits their usefulness in a membrane valve context.

The most noticeable issue with using non-elastomeric, non-polymeric, non-metallic materials is that such materials are typically much stiffer than elastomeric materials, thereby limiting the amount of travel that a membrane made of such materials may experience in response to applying a given pressure differential to it. Moreover, most such materials that are well-suited for use with the various gases used in semiconductor processing equipment, e.g., materials that are largely non-reactive with such gases (such as silicon and quartz), may have very low plasticity and may fracture if subjected to excessive flexure. In contrast, elastomeric materials, due to their stretchy and compliant nature, are able to undergo radical deformation without fracturing.

FIG. 1 depicts an example apparatus with a non-elastomeric, non-polymeric, non-metallic microfluidic valve structure. In FIG. 1, the apparatus 100 is implemented in a substrate 102, in which multiple patterned layers 104, e.g., layers 104a-104g, are arranged to provide a microfluidic valve structure 106. The number and arrangement of layers 104 may vary from what is depicted, and it will be understood that any arrangement of layers that may arrive at structures with characteristics similar to those discussed here falls within the scope of this disclosure. These layers may be bonded together using any suitable bonding technique, e.g., diffusion bonding, fusion bonding, etc.

The layers 104 of the substrate 102 may be configured to provide a diaphragm 108, e.g., a thin, circular region, that may serve as a flexible membrane interposed between an actuator plenum 132 and a valve plenum 138. The diaphragm 108 may have a first side 110 and a second side 112, as well as a nominal diameter $D_{vpl}$. The valve plenum 138 may generally be defined as an open volume sandwiched between the first side 110 and a base 114 and bounded by an outer perimeter of the diaphragm 108. The valve plenum 138 may include a raised seat structure 120 that may protrude up from the base 114 and extend towards the first side 110 of the diaphragm 108. The raised seat structure 120 may, for example, form a continuous wall about a central region thereof, and have a surface 122 that faces towards the first side 110 of the diaphragm 108. In some implementations, such as that shown in FIG. 1, the raised seat structure 120 may be an annular wall that extends from the base 114 up towards the first side 110 of the diaphragm 108.

An orifice 118 may be located within the central region of the raised seat structure 120, e.g., located in the center of the central region of the raised seat structure 120, and may pass through the base 114. The orifice 118 may also be located at other locations within the central region of the raised seat structure 120, e.g., at locations within the central region of the raised seat structure 120 that are not centered on the raised seat structure 120. The orifice 118 may fluidically connect the valve plenum 138 with a gas inlet 124, which may be used to supply a semiconductor processing gas from a gas supply (not shown) to the microfluidic valve structure 106. The valve plenum 138 may be fluidically connected with an outlet port 116 through which processing gas may flow when the microfluidic valve structure 106 is in an open state and the gas inlet 124 is fluidically connected with a gas supply for such a processing gas. The orifice 118 may have any desired cross-sectional shape, although in the examples discussed herein, the orifice 118 has a circular cross-sectional shape of diameter D.

Control for the microfluidic valve structure 106 may be provided through any suitable mechanism for causing the diaphragm 108 to flex. For example, the actuator plenum 132 may be interfaced with a controllable pneumatic source, e.g., a valve attached to a pressurized air source, that allows the actuator plenum 132 to be controllably pressurized, thereby causing the diaphragm 108 to flex and distend into the valve plenum 138, thereby causing the first side 110 of the diaphragm 108 to move towards the surface 122. When the diaphragm 108 is sufficiently distended, the first side 110 of the diaphragm 108 may contact the surface 122, thereby sealing the raised seat structure 120 and preventing further flow of gas from the orifice 118 and out of the raised seat structure 120. When the microfluidic valve structure is in an unactuated state, the first side 110 and the surface 122 may be separated by a gap 126 of distance d.

The microfluidic valve structure pictured in FIG. 1 may be used regardless of flow direction (e.g., with gases flowing in the direction indicated, or with gases flowing in the opposite direction). However, in scenarios in which the orifice 118 is fluidically interposed between a supply of gas and the diaphragm 108, the upstream placement of the orifice 118 relative to the diaphragm 108 may provide a significant advantage. The term "fluidically interposed," as used herein, refers to a condition where a first structure in a fluidic flow system is positioned relative to two second structures in the fluidic flow system such that fluid flowing from one of the second structures to the other second structure must necessarily come into contact with, or flow by, the first structure prior to reaching the other second structure. For example, a kitchen sink would be described as being fluidically interposed between the kitchen faucet for that sink and the drain for that sink. Similarly, a house's main water shut-off valve would be described as being fluidically interposed between a water main in the street and the interior plumbing of the house.

As gas flows through the microfluidic valve structure 106 in the manner depicted, it may encounter two general regions of increased flow resistance. The first region is the orifice 118, which may generally be sized to act as a sonic flow restrictor, e.g., configured such that gas flowing through the orifice 118 develops into sonic, fully choked flow, i.e., M=1, within the orifice 118. If the dimensions of the orifice 118 are tightly controlled, as may be achieved through lithographic techniques, it may be possible to achieve very precise orifice dimensions. Such precise dimensional control, coupled with fully choked flow, may allow for very precise time-based metering of gas flow through the microfluidic valve structure.

The second region is in the annular region sandwiched between the surface 122 and the first side 110 and having a height defined by the gap 126. This region may have a flow resistance that is governed in large part by factors such as the inner ($D_i$) and outer ($D_o$) dimensions, e.g., inner and outer diameters, of the raised seat structure 120, as well as the gap distance d.

If the gas flow is in the opposite direction from that shown in FIG. 1, i.e., with the diaphragm 108 fluidically interposed between the gas supply and the orifice 118, the diaphragm 108, and the annular gap between the diaphragm 108 and the surface 122 of the raised seat structure 120, will be upstream of the orifice. In such a scenario, if choked flow occurs in the region between the diaphragm 108 and the surface of the raised seat structure 120, then choked flow will generally not develop at the orifice 108 downstream. In such a scenario, the orifice 118 is no longer an effective mechanism for controlling or metering gas flow and becomes superfluous. The mass flow rate through the annular gap at choked flow may be influenced by various factors, including the gap distance d between the diaphragm 108 and the surface 122 of the raised seat structure 120, the inner diameter $D_i$ of the raised seat structure 120, and the radial thickness of the raised seat structure 120 ($0.5 \cdot (D_o - D_i)$). Two of these factors may be controlled through manufacturing tolerances, but it is difficult to control the gap distance d, as this value may fluctuate during use depending on, for example, pressure conditions within the valve plenum 138 and/or atmospheric pressure conditions.

Additionally, it may generally be desirable to generally reduce the gap distance d since the smaller the distance d is, the smaller the gap is through which the diaphragm must be displaced in order to contact the surface 122 of the raised seal structure 120. Given the limited flexibility of non-elastomeric, non-polymeric, non-metallic materials, e.g., quartz or glass, the range of motion that a diaphragm 108 made of such material may provide for a given size of diaphragm may be quite limited.

Thus, for a configuration where the diaphragm 108 is fluidically interposed between the gas supply and the orifice 118, the microfluidic valve structure may either use a large gap size, which may require a larger diameter diaphragm but may avoid potential choked flow in the annular gap area, or a small gap size, which allows for a smaller diameter diaphragm but may increase the chance that choked flow will occur in the annular gap instead of the orifice 118 (an attempt may also be made to size the gap "just right," but since the gap size may fluctuate with environmental conditions, e.g., due to the ambient pressure environment, such efforts may not produce reliable performance).

If one configures the diaphragm 108, orifice 118, and gas supply as suggested by FIG. 1, however, with the orifice 118 fluidically interposed between the gas source and the diaphragm 108, then choked flow through the orifice 118 may be produced for a given flow regime with a much smaller gap distance d than may be utilized in the opposite arrangement.

Figure 2:
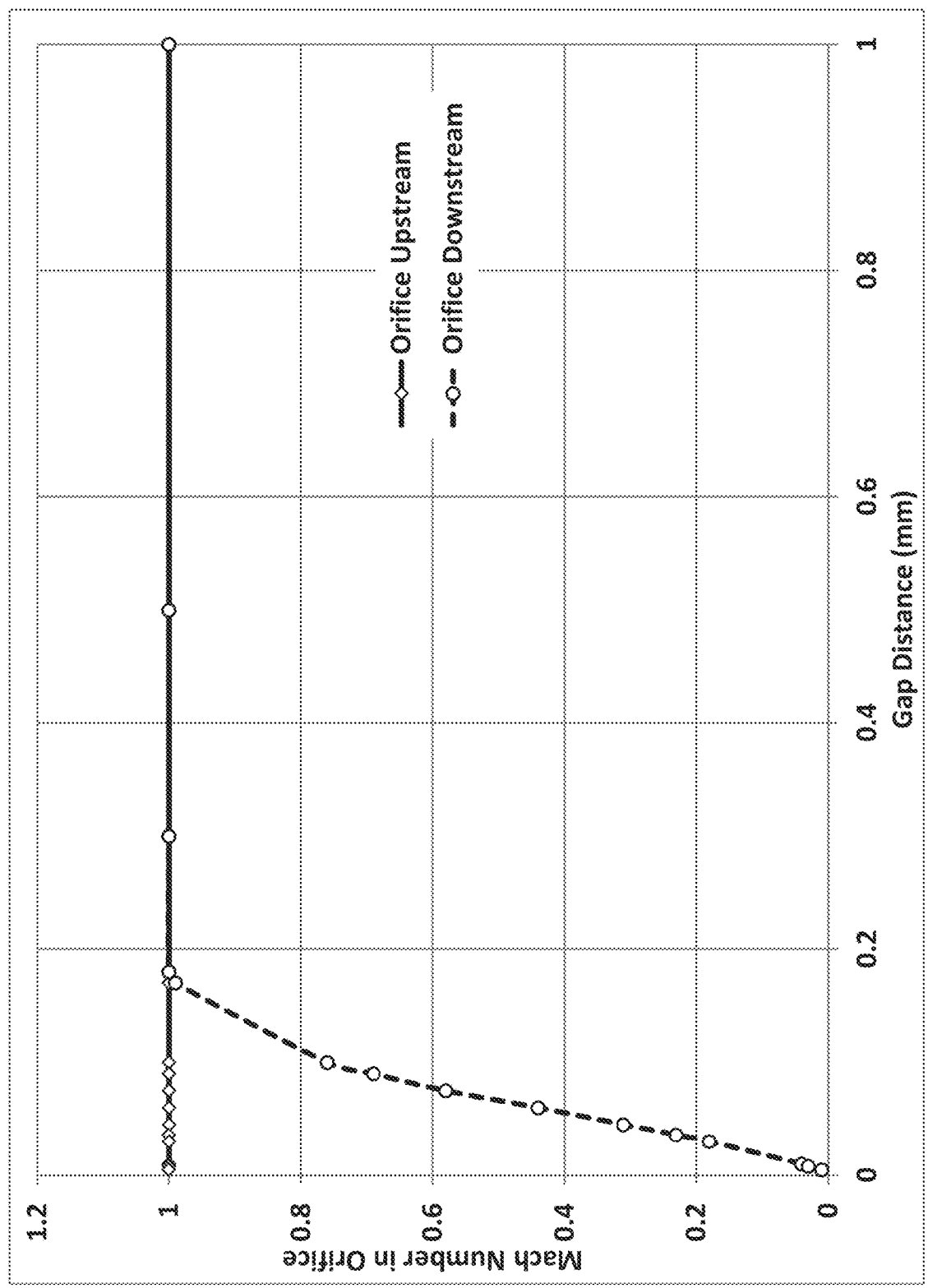
FIGS. 2 through 4 show Mach numbers in an orifice for a non-elastomeric, non-polymeric, non-metallic microfluidic valve structure under various flow conditions for two different arrangements of such valve structures.

For example, in fluid simulations performed on an example orifice 118 with a diameter d=0.3 mm and a raised seat structure 120 having a diameter $D_i$=1 mm for a flow of 10 standard cubic centimeters per minute (SCCM) of argon, it was observed that the Mach number for flow through the orifice 118 remained relatively constant at 1 for a range of gap sizes from 0.005 mm to 1 mm when the orifice was fluidically interposed between the gas source and the diaphragm, but in an identical configuration where the diaphragm was fluidically interposed between the gas source and the orifice, the Mach number for flow through the orifice 118 remained similarly constant at 1 for gap sizes larger than 0.2 mm, but rapidly dropped to 0.01 for gap sizes between 0.005 mm and 0.2 mm. FIG. 2 shows a plot of such behavior (Orifice Upstream=orifice fluidically interposed between the gas source and the diaphragm; Orifice Downstream=diaphragm fluidically interposed between the gas source and the orifice). From this simulation data, it can be seen that positioning the orifice such that it is fluidically interposed between the gas source and the diaphragm permits the use of gap distances d as low as −0.005 mm without loss of choked flow in the orifice 118, whereas fluidically interposing the diaphragm between the gas source and the orifice requires a gap distance d of −0.2 mm or more to ensure that choked flow occurs within the orifice.

Figure 3:
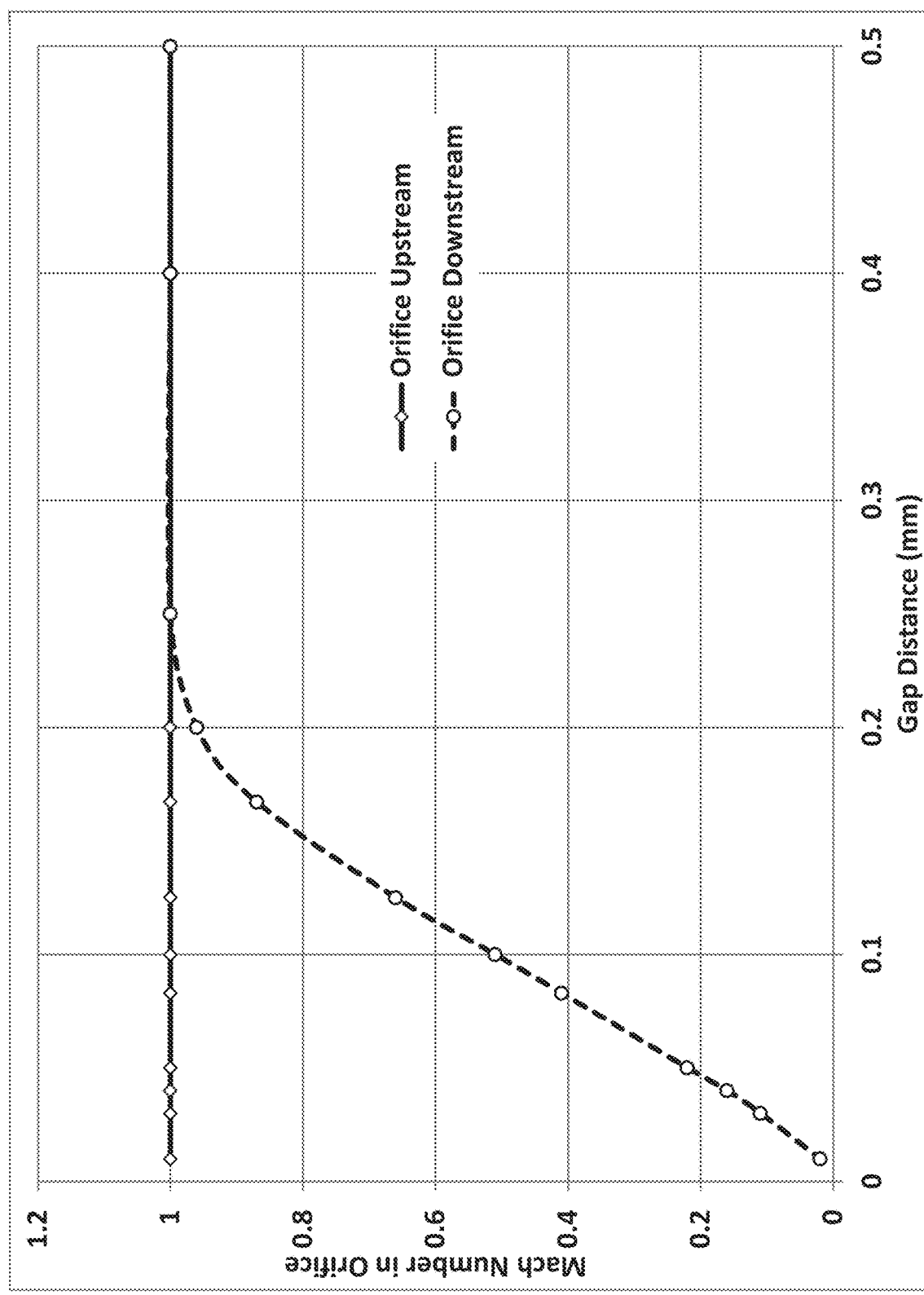
Figure 4:
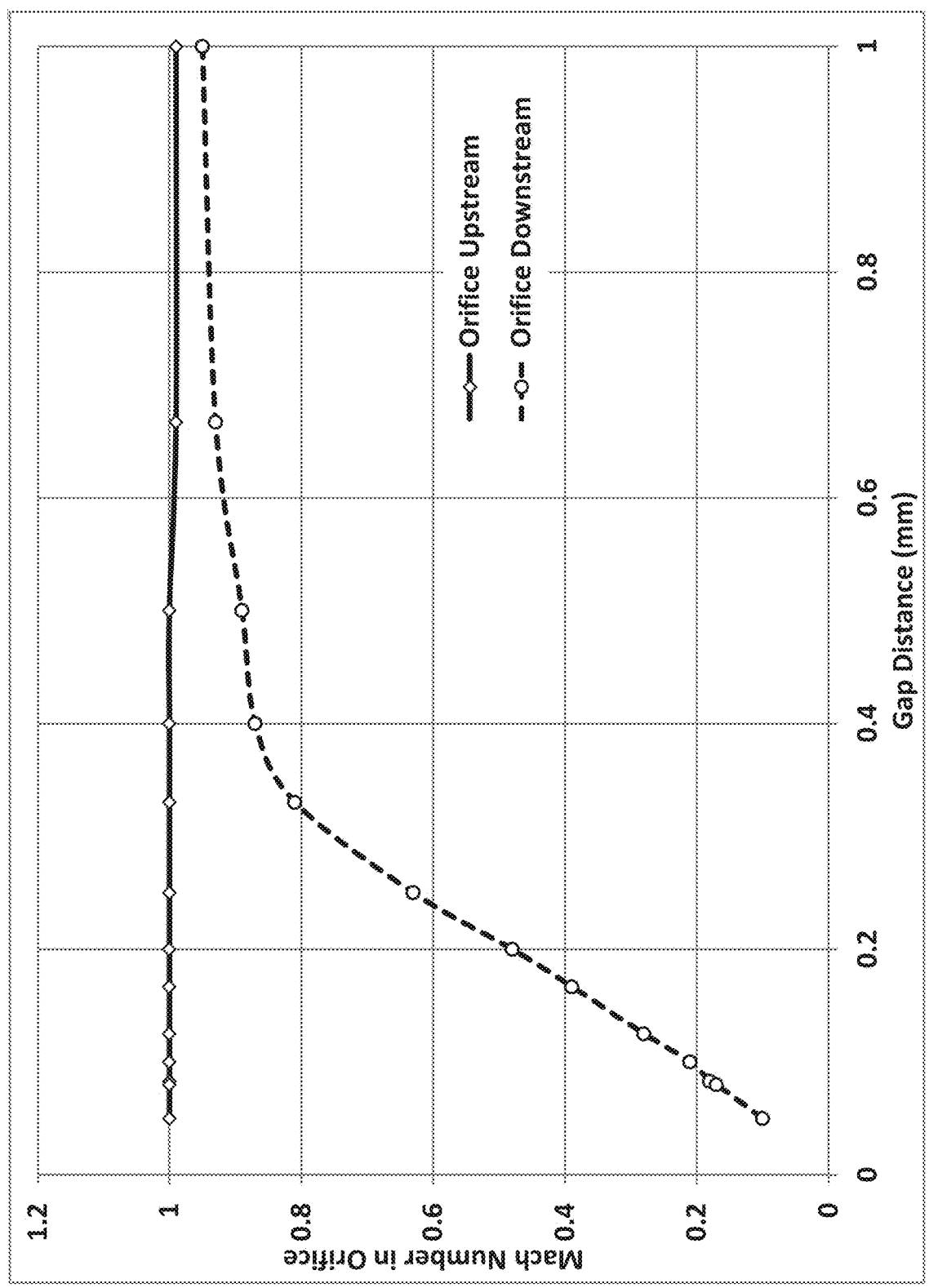

FIGS. 3 and 4 depict similar plots of simulation data. FIG. 3 depicts a plot of a simulation similar to that of FIG. 2, except that the example orifice 118 had a diameter d=0.5 mm, the raised seat structure 120 had a diameter $D_i$=1 mm, and a flow of 30 standard cubic centimeters per minute (SCCM) of argon was introduced through the microfluidic valve structure 106. Similarly, FIG. 4 depicts a plot of a simulation similar to that of FIG. 2, except that the example orifice 118 and the raised seat structure 120 both had diameters $D_i$ and D=1 mm, and a flow of 120 standard cubic centimeters per minute (SCCM) of argon was introduced through the microfluidic valve structure 106. In both of these additional cases, similar behavior may be observed, i.e., positioning the orifice such that it is fluidically interposed between the gas source and the diaphragm permits the use of much smaller gap distances d, e.g., 0.01 mm or 0.05 mm, while still maintain choked flow conditions in the orifice 118, whereas positioning the diaphragm such that it is fluidically interposed between the gas source and the orifice requires that the gap distance d be kept, for example, to 2.5 mm or higher (for the scenario of FIG. 3; for the scenario of FIG. 4, fully choked flow never actually develops for the scenarios simulated).

In the non-elastomeric, non-polymeric, non-metallic microfluidic valve structures discussed herein, the membrane/diaphragm of a microfluidic valve structure may be configured to have a very small actuation gap, i.e., the distance through which the diaphragm must move, in order to seal against an orifice of the valve structure and obstruct fluid flow. The actuation gap may generally be driven by the size of the diaphragm, with larger diaphragms permitting larger displacements and thus allowing for larger actuation gaps. For example, a microfluidic valve structure having a silicon-based diaphragm with an effective diameter of 5 mm may be configured to only permit 0.04 mm of deflection before sealing against an orifice of the valve structure. However, as mentioned earlier, for microfluidic valve structures intended to function with semiconductor processing equipment in which the gases flowed through the microfluidic valve structure may flow into a sub-atmospheric environment, the diaphragm may be exposed to a preexisting pressure differential when in an unactuated state, e.g., sub-atmospheric pressure on the first side of the diaphragm, and atmospheric pressure (or a pressure higher than the sub-atmospheric pressure on the first side of the diaphragm) on the second side of the diaphragm. As a result, the diaphragm may, even when not actively actuated, be in a partially distended or flexed state—actuation by increasing the pressure on the second side of the diaphragm may simply cause the diaphragm to deflect or distend further until the first side of the diaphragm contacts the raised seat structure.

This issue is peculiar to microfluidic valves in the context of semiconductor processing tools, and imposes some practical limitations on such valves that are not encountered in normal microfluidic systems, e.g., liquid-handling microfluidic systems as may be used for genetic, chemical, or biological fluidic analysis. For example, diaphragm deflection as a function of constant pressure increases non-linearly in conjunction with increasing diaphragm diameter. Thus, increasing the diaphragm diameter may provide for greater potential travel allowances in the diaphragm, but at the cost of increased "static" deflection due to atmospheric pressure, which acts to reduce the size of the gap in between the diaphragm 108 and the surface 122 of the raised seat structure that is available and which may also cause increased stresses in the diaphragm, which may lead to earlier failure. The other detriment to increasing diaphragm diameter is that fewer microfluidic valve structures may be manufactured at a time. As mentioned earlier, lithographic techniques may be used to manufacture the layers of the microfluidic devices described herein. In such techniques, a large number of microfluidic valve structures may be manufactured on a single wafer, e.g., a silicon wafer. Such manufacturing techniques are expensive to implement, and become more cost-effective when large numbers of microfluidic valve structures are manufactured simultaneously on one wafer. Accordingly, since fewer microfluidic valve structures can fit on a given size wafer as the diameter of the diaphragm 108 is increased in size, it may be beneficial to reduce or minimize the diameter of the diaphragm in many implementations. In particular, the present inventors have found that, in some implementations, restricting the diameter $D_{vpi}$ to a value on the order of a centimeter or less, e.g., 10 mm, 9 mm, 8 mm, 7 mm, 6, mm, 5 mm, 4 mm, or 3 mm, 2 mm, 1 mm, or values therebetween.

The diameter of the diaphragm, as well as the nature of the material used to provide the diaphragm, may effectively govern the maximum amount of travel that the diaphragm may provide (without failing) when the second side of the diaphragm is subjected to a given pressure environment. This maximum amount of travel may, in turn, govern the size of the gap distance d, taking into account, if needed, any pre-actuation displacement due to atmospheric pressure effects. For example, a microfluidic valve structure with a 5 mm diameter 85 µm thick diaphragm may have a gap distance of 0.040 mm, although this gap distance is conservative and larger gap distances may be used in some instances, e.g., up to 0.125 mm in some implementations.

The orifice may generally be selected according to the flow characteristics of the gas that are desired for a given semiconductor processing tool utilizing the microfluidic valve structure. The orifice may have dimensions that are selected to produce choked flow therethrough for a range of flow rates desired for a semiconductor processing operation provided by the semiconductor processing tool. For example, orifice diameters of 0.2 mm, 0.3 mm, 0.4 mm, 0.5 mm, 0.6 mm, 0.7 mm, 0.8 mm, 0.9 mm, or 1 mm, or values therebetween, may be used in various implementations.

The dimensions of the raised seat structure may be selected in accordance with the orifice size, gap distance, and the diaphragm diameter. For example, the inner diameter $D_i$ of the raised seat structure may be selected to be less than or equal to $0.2 \cdot D_d$, where $D_d$ is the nominal diameter of the diaphragm, e.g., $D_{vpl}$. The inner diameter $D_i$, gap distance d, and orifice diameter D may be selected such that $A_o$ is less than or equal to $$\frac{\pi}{2} \cdot d \cdot D_i,$$

where $A_o$ is the cross-sectional area of the orifice, e.g., for a circular orifice, $A_o = \pi \cdot D^2/4$. In various implementations, $$A_o \leq \frac{\pi}{2} \cdot d \cdot D_i \text{ and } A_o \geq 0.9 \cdot \frac{\pi}{2} \cdot d \cdot D_i, A_o \geq 0.8 \cdot \frac{\pi}{2} \cdot d \cdot D_i,$$

$$A_o \geq 0.7 \cdot \frac{\pi}{2} \cdot d \cdot D_i, A_o \geq 0.6 \cdot \frac{\pi}{2} \cdot d \cdot D_i,$$

$$A_o \geq 0.5 \cdot \frac{\pi}{2} \cdot d \cdot D_i, \text{ or } A_o \geq \frac{\pi}{2 \cdot 625} \cdot d \cdot D_i.$$

The various layers of the microfluidic valve structures disclosed herein may be configured in a variety of different ways. For example, some implementations may feature layers having through-features that are then bonded to layers that do not have corresponding through-features so as to make blind holes or internal chambers within the layer stack. In other implementations, blind holes may be formed directly in a layer without requiring any bonding, e.g., through etching or machining a feature to a depth that is less than the thickness of that layer. The thicknesses of various layers may be selected as desired depending on the needs of a particular application. For example, in some microfluidic valve structures, the diaphragm may be between 15 μm and 120 μm thick, e.g., on the order of 0.085 mm thick; the thickness of the diaphragm, of course, governs, at least in part, the travel that may be realized by the diaphragm during actuation.

In some implementations, the base may be between 100 μm and 1000 μm thick, e.g., 0.725 mm thick; the thickness of the base may be selected so as to be structurally able to support the raised seat structure and survive the operating pressures within the valve structure. However, the thickness of the base may also determine the length of the orifice; a too-long orifice may experience an undesirable increase in flow resistance.

Figure 5:
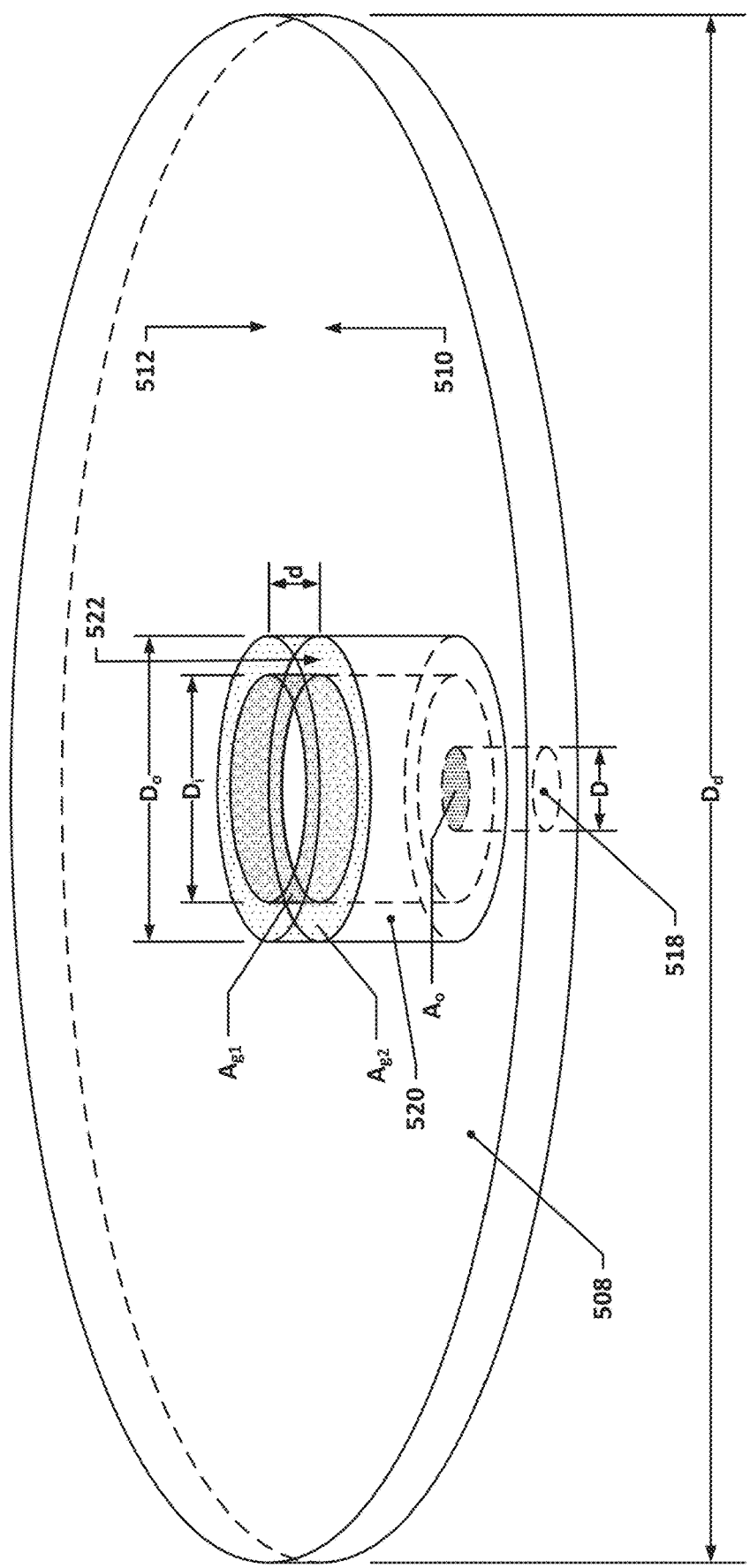
FIG. 5 provides a simplified perspective view of various elements of a microfluidic valve structure.

FIG. 5 provides a simplified perspective view of various elements of a microfluidic valve structure as discussed above. In FIG. 5, a diaphragm 508 of diameter $D_d$ is shown in conjunction with a raised seat structure 520, which has a surface 522 that faces a first side 510 of the diaphragm 508 and is separated from the first side 510 by a gap of distance d. A second side 512 of the diaphragm 508 (the top side in FIG. 5) may be pressurized to drive the diaphragm 508 into contact with the surface 522 of the raised seat structure 520. The raised seat structure 520 may have an inner diameter $D_i$ and an outer diameter $D_o$ that may each, in conjunction with the gap distance d, define cylindrical reference surfaces of areas $A_{g1}$ and $A_{g2}$, e.g., by multiplying the circumference associated with each respective diameter by the gap distance d. An orifice 518 may be located in a base (not picture) of the microfluidic valve structure; the orifice may have a cross-sectional surface area $A_o$. Generally speaking, $A_{g1}$ may be selected to be greater than twice $A_o$.

In some implementations, the diaphragm 108 may be implemented in a particular manner, e.g., with different diameters used to define the first side 110 and the second side 112. For example, as shown in Figure AA, the first side 110 of the diaphragm 108, and the valve plenum 138, may be defined by the nominal diaphragm diameter $D_{vpl}$, and the second side 112 of the diaphragm 108, and the actuator plenum 132, may be defined by a nominal actuator plenum diameter $D_{apl}$. As can be seen, the actuator plenum 132 may be provided in an actuator plenum layer 134 (layer 140a), which may have a hole through it of diameter $D_{vpl}$. Similarly, the valve plenum 138 may be provided in a valve plenum layer 140 (layer 140c), which may have a hole through it of diameter $D_{apl}$. By avoiding a structure in which $D_{vpl}$ and $D_{apl}$ are the same, the stresses in the corners where the layers 140a and 140c meet with the layer 140b that provides the diaphragm 108 may be significantly reduced, offering more robust valve operation and a lower chance of valve failure.

Figure 6:
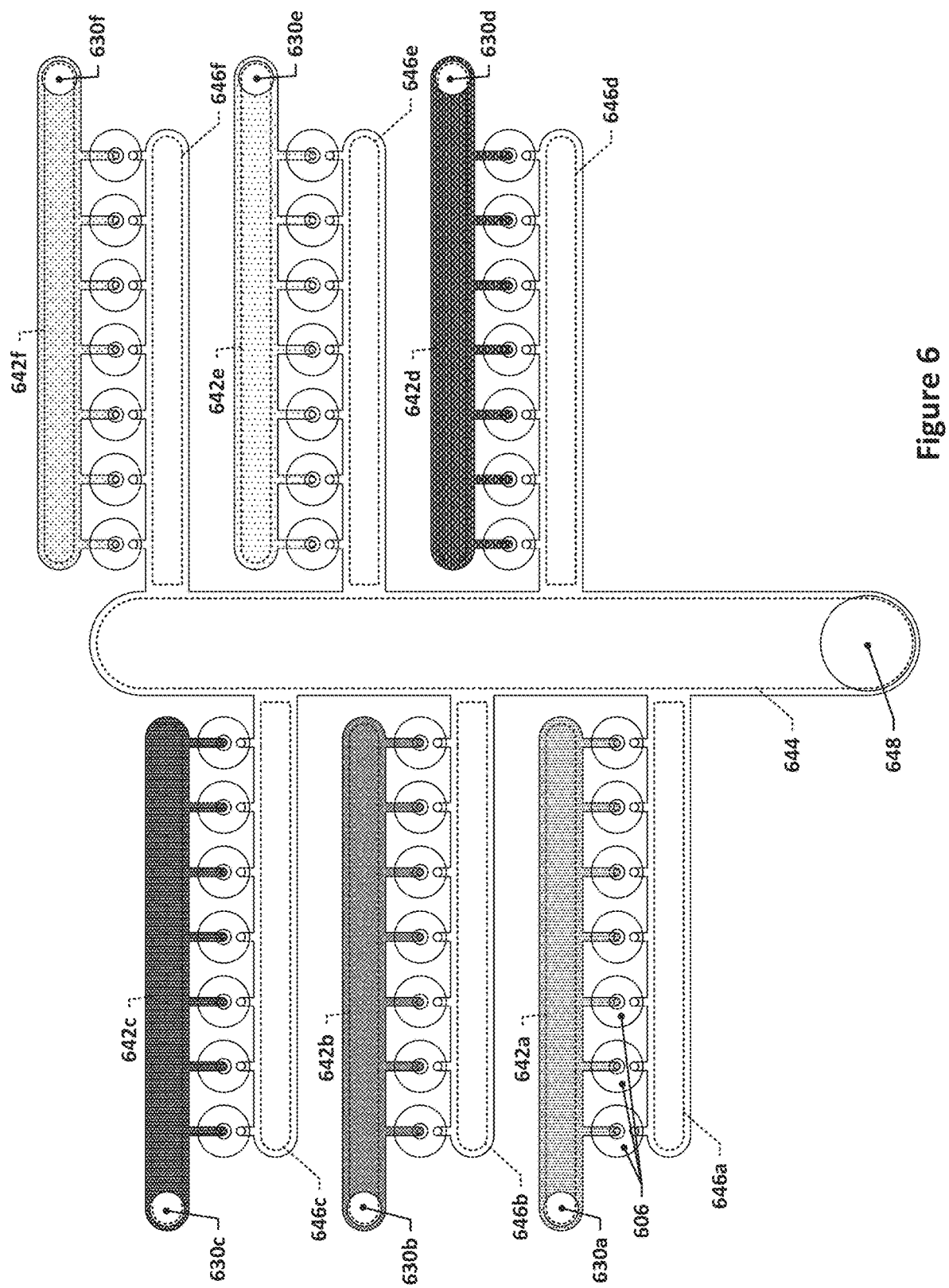
FIG. 6 depicts a diagram of a flow splitter for combining a plurality of gases together in a controllable manner.
Figure 7:
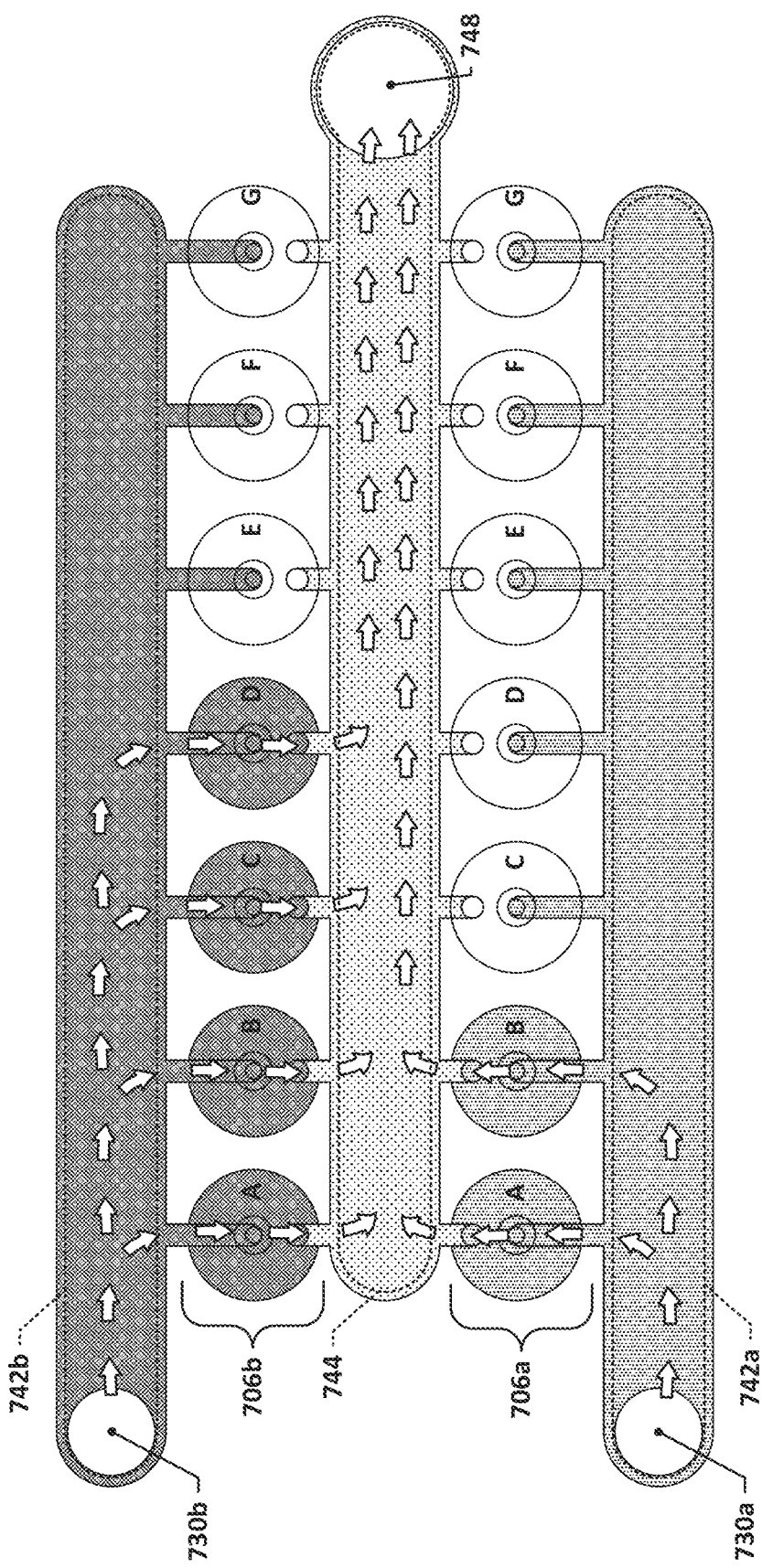
FIG. 7 depicts an example of a two-source flow splitter.

Non-elastomeric, non-polymeric, non-metallic microfluidic valve structures such as those disclosed herein may be used in a variety of ways in semiconductor processing equipment. FIGS. 6 and 7 depict one example implementation in which such microfluidic valve structures may be used. FIG. 6 depicts a diagram of a flow splitter for combining a plurality of gases together in a controllable manner. In FIG. 6, a plurality of gas sources 630a-630f are provided. Each gas source 630 may, for example, receive gas from a pressurized gas source or vessel. The gas sources 630 may each, in turn, be fluidically connected with an inlet gallery 642, e.g., gas source 630a may be fluidically connected with inlet gallery 642a, gas source 630b may be fluidically connected with inlet gallery 642b, and so forth. Each inlet gallery 642 may, in turn, be fluidically connected with a corresponding branch passage 646 by a corresponding plurality of non-elastomeric, non-polymeric, non-metallic microfluidic valve structures 606 (only three are called out in FIG. 6, but it is readily apparent that there are seven such microfluidic valve structures 606 for each inlet gallery 642). In this example, each inlet gallery is fluidically connected with seven microfluidic valve structures, although it will be understood that more or fewer such microfluidic valve structures may be provided, and that two or more of the gas supplies 630 may be joined with their respective branch passages 642 by a different number of microfluidic valve structures 606 (rather than the same number of microfluidic valve structures for each). The branch passages 646 may, in turn all join up at a common outlet passage 644 that may lead to a mixed gas outlet 648.

In a flow splitter such as that shown in FIG. 6, the microfluidic valve structures 606 may be kept in a closed state, e.g., by pressurizing the diaphragms using pneumatic valves and pressurized air, thereby preventing the process gases provided by the gas sources 630 from flowing into the branch passages 646. If a particular combination of process gases is desired in a particular mixing ratio and/or flow rate, then an appropriate number of the microfluidic valve structures 606 for each of those gas supplies 130 may be actuated into an open state, thereby allowing those process gases to flow into their respective branch passages 646 and into the common outlet passage 644. For example, if a 1:3:7 ratio of gases from gas supplies 630a, 630c, and 630d, respectively, is desired, then one microfluidic valve structure 606 fluidically connecting the inlet gallery 642a and the branch passage 646a may be opened, three microfluidic valve structures 606 fluidically connecting the inlet gallery 642c and the branch passage 646c may be opened, and seven microfluidic valve structures 606 fluidically connecting the inlet gallery 642d and the branch passage 646d may be opened. Assuming that the orifices of each microfluidic valve structure 606 are the same size, the fully choked flow that may be provided through each orifice of each open microfluidic valve structure may provide the desired gas ratio.

FIG. 7 depicts an example of a two-source flow splitter. In FIG. 7, two gas sources 730a and 730b are connected to respective pressurized gas supplies and supply corresponding process gases to inlet galleries 742a and 742b, respectively. Each inlet gallery 742 is, in turn fluidically connected with a common outlet passage 744 by a plurality of corresponding microfluidic valve structures 706a and 706b. The common outlet passage 744 leads to a mixed gas outlet 748. In this particular example, instances A and B of the microfluidic valve structures 706a are in an open state (this may be the default, unactuated state in some implementations), whereas instances C, D, E, F, and G of the microfluidic valve structures 706a are in a closed state. Similarly, instances A, B, C, and D of the microfluidic valve structures 706b are in an open state, whereas instances E, F, and G of the microfluidic valve structures 706a are in a closed state. Thus, the mixing ratio of gas from the gas source 730a to the gas source 730b may be 1:2.

It will be recognized that many other implementations of microfluidic valve structures may be practiced using the microfluidic valve structures disclosed in this application. For example, one such implementation is a semiconductor processing showerhead, e.g., a gas distributor that distributes processing gases over a semiconductor wafer during processing operations. Showerheads typically have a large number, e.g., hundreds or thousands, of gas distribution ports spread across the underside of the showerhead—an area that is generally at least as large in diameter as the wafer being processed. Process gas flows through the showerhead are typically regulated by valves that are located outside of the showerhead. For externally located valves, there may be a significant delay, e.g., some seconds, between when the valve is opened and the gas flowing therethrough is released by the showerhead (this delay is due to the need for the gas to flow from the valve, through the showerhead, and through the gas distribution ports on the underside (or faceplate) of the showerhead. There may also be a significant amount of wasted gas trapped within the showerhead after each gas flow.

As discussed in U.S. patent application Ser. No. 15/346,920, filed Nov. 11, 2016, a more effective showerhead may be provided by implementing microfluidic valve structures, such as those disclosed herein, within the showerhead, e.g., at each gas distribution port. In this manner, the flow path from each microfluidic valve structure to gas distribution port may generally be as short as is feasible, thereby reducing transit time for the gases released thereby. In some implementations, each microfluidic valve structure, or groups of such valve structures, may be separately actuable, thereby allowing groups of valves to be actuated or unactuated and allowing different flow patterns of gas to be provided by the showerhead. It will be understood that the microfluidic valve structures discussed herein may be used to provide the valves for the active showerheads discussed in U.S. patent application Ser. No. 15/346,920, the contents of which are hereby incorporated by reference in their entirety.

As mentioned above, the microfluidic valve structures discussed herein may be actuated by any suitable mechanism, e.g., through actuation of pneumatic valves that may be used to pressurize the diaphragms of such valve structures. Such pneumatic valves may be controlled by a controller of a semiconductor processing tool. The controller may be part of a system that may include semiconductor processing equipment, including a processing tool or tools, chamber or chambers, platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, as well as various parameters affecting semiconductor processing, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The term "wafer," as used herein, may refer to semiconductor wafers or substrates or other similar types of wafers or substrates. A wafer station, as the term is used herein, may refer to any location in a semiconductor processing tool in which a wafer may be placed during any of various wafer processing operations or wafer transfer operations. Wafer support is used herein to refer to any structure in a wafer station that is configured to receive and support a semiconductor wafer, e.g., a pedestal, an electrostatic chuck, a wafer support shelf, etc.

It is also to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

It is to be understood that use of the word "each," such as in the phrase "for each <item> of the one or more <items>" or "of each <item>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, when a selected item may have one or more sub-items and a selection of one of those sub-items is made, it will be understood that in the case where the selected item has one and only one sub-item, selection of that one sub-item is inherent in the selection of the item itself.

It will also be understood that references to multiple controllers that are configured, in aggregate, to perform various functions are intended to encompass situations in which only one of the controllers is configured to perform all of the functions disclosed or discussed, as well as situations in which the various controllers each perform subportions of the functionality discussed. For example, an autocalibration wafer may include a controller that is configured to control the operation of the various sensors on the autocalibration wafer and communicate data therefrom to another controller associated with a semiconductor processing tool; the semiconductor processing tool controller may then analyze such data to determine various operational parameters for use with the semiconductor processing tool.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
a substrate having one or more microfluidic valve structures, each microfluidic valve structure of the one or more microfluidic valve structures including:
   a diaphragm having a first side, and a second side opposite the first side;
   a base;
   an orifice in the base; and
   a raised seat structure, wherein, for each microfluidic valve structure:
      the diaphragm is made from a non-elastomeric material,
      the raised seat structure extends from the base towards the first side of the diaphragm,
      a surface of the raised seat structure facing the diaphragm is separated from the first side of the diaphragm by a gap when the microfluidic valve structure is in an undeformed state, and
      the diaphragm, the raised seat structure, and the gap of that microfluidic valve structure are sized such that, when that microfluidic valve structure is transitioned to an actuated state by pressurizing the second side of the diaphragm to a first pressure,
   a portion of the diaphragm is caused to elastically deform towards, and seal against, the raised seat structure.

2. The apparatus of claim 1, wherein the diaphragm is made of a non-polymeric, non-elastomeric material.

3. The apparatus of claim 2, wherein the raised seat structure and the base are also made of non-polymeric, non-elastomeric material or materials.

4. The apparatus of claim 1, wherein the diaphragm is made of a non-metallic, non-elastomeric material.

5. The apparatus of claim 4, wherein the raised seat structure and the base are also made of non-metallic, non-elastomeric material or materials.

6. The apparatus of claim 1, wherein the diaphragm is made of a non-polymeric, non-metallic, non-elastomeric material.

7. The apparatus of claim 6, wherein the raised seat structure and the base are also made of non-polymeric, non-metallic, non-elastomeric material or materials.

8. The apparatus of claim 6, wherein the non-polymeric, non-metallic, non-elastomeric material comprises silicon.

9. The apparatus of claim 6, wherein the non-polymeric, non-metallic, non-elastomeric material comprises silicon dioxide.

10. The apparatus of claim 1, wherein:
the substrate includes a first inlet passage and a first outlet passage,
the one or more microfluidic valve structures includes a first set of microfluidic valve structures,
each microfluidic valve structure in the first set of microfluidic valve structures is fluidically interposed between the first inlet passage and the first outlet passage, and
the orifice in each microfluidic valve structure in the first set of microfluidic valve structures is fluidically interposed between the first inlet passage and the diaphragm of that microfluidic valve structure.

11. The apparatus of claim 10, wherein each microfluidic valve structure in the first set of microfluidic valve structures is independently actuatable from each other microfluidic valve structure in the first set of microfluidic valve structures.

12. The apparatus of claim 10, wherein:
the substrate further includes one or more additional inlet passages,
the substrate further includes a corresponding additional outlet passage for each additional inlet passage,
the one or more microfluidic valve structures includes a corresponding set of microfluidic valve structures for each additional inlet passage,
each microfluidic valve structure in each set of microfluidic valve structures corresponding to one of the one or more additional inlet passages is fluidically interposed between that additional inlet passage and the corresponding outlet passage, and
the orifice in each microfluidic valve structure in each set of microfluidic valve structures corresponding to one of the one or more additional inlet passages is fluidically interposed between that additional inlet passage and the diaphragm of that microfluidic valve structure.

13. The apparatus of claim 12, wherein each microfluidic valve structure in the corresponding set of microfluidic valve structures for each additional inlet passage is independently actuatable relative to each other microfluidic valve structure in the corresponding set of microfluidic valve structures for that additional inlet passage.

14. The apparatus of claim 12, wherein:
the first outlet passage and each additional outlet passage branch off of a common outlet passage,
the first outlet passage is fluidically interposed between the common outlet passage and the microfluidic valve structures in the first set of microfluidic valve structures, and
each additional outlet passage is fluidically interposed between the common outlet passage and the microfluidic valve structures in the set of microfluidic valve structures corresponding to the additional inlet passage that corresponds to that additional outlet passage.

15. The apparatus of claim 10, wherein:
the substrate includes a second inlet passage,
the one or more microfluidic valve structures includes a second set of microfluidic valve structures,
each microfluidic valve structure in the second set of microfluidic valve structures is fluidically interposed between the second inlet passage and the first outlet passage, and the orifice in each microfluidic valve structure in the second set of microfluidic valve structures is fluidically interposed between the second inlet passage and the diaphragm of that microfluidic valve structure.

16. The apparatus of claim 15, wherein:
each microfluidic valve structure in the first set of microfluidic valve structures is independently actuatable from each other microfluidic valve structure in the first set of microfluidic valve structures, and
each microfluidic valve structure in the second set of microfluidic valve structures is independently actuatable from each other microfluidic valve structure in the second set of microfluidic valve structures.

17. The apparatus of claim 1, further comprising:
a diaphragm layer;
an actuator plenum layer; and
a valve plenum layer, wherein:
   the diaphragm of a first microfluidic valve structure of the one or more microfluidic valve structures is provided by the diaphragm layer,
   a first side of the diaphragm layer provides the first side of the diaphragm of the first microfluidic valve structure, a second side of the diaphragm layer provides the second side of the diaphragm of the first microfluidic valve structure, the first side of the diaphragm layer is bonded to the valve plenum layer, the second side of the diaphragm layer is bonded to the actuator plenum layer, the actuator plenum layer has a hole through it that is centered on the diaphragm of the first microfluidic valve structure, and the valve plenum layer has a hole through it that is also centered on the diaphragm of the first microfluidic valve structure.

18. The apparatus of claim 1, further comprising a showerhead with a plurality of gas distribution ports distributed across an underside thereof, wherein at least one of the one or more microfluidic valve structures is configured to control flow of gas through a corresponding one of the gas distribution ports and is positioned within the showerhead.

19. The apparatus of claim 18, further comprising a processing chamber, wherein the underside of the showerhead is configured to distribute gas flowed through the gas distribution ports into the processing chamber.

20. The apparatus of claim 1, wherein the apparatus is configured to be connected to a gas supply such that at least a first microfluidic valve structure of the one or more microfluidic valve structures is part of a flow path within the apparatus that is configured to be fluidically connectable with the gas supply such that the raised seat structure for the first microfluidic valve structure is fluidically interposed between the gas supply and the diaphragm for the first microfluidic valve structure.

* * * * *